(12) United States Patent
Zhang et al.

(10) Patent No.: US 11,981,560 B2
(45) Date of Patent: May 14, 2024

(54) STRESS-ISOLATED MEMS DEVICE COMPRISING SUBSTRATE HAVING CAVITY AND METHOD OF MANUFACTURE

(71) Applicant: Analog Devices, Inc., Wilmington, MA (US)

(72) Inventors: Xin Zhang, Acton, MA (US); Christopher Needham, Ipswich, MA (US); Andrew Proudman, Stoneham, MA (US); Nikolay Pokrovskiy, Billerica, MA (US); George M. Molnar, II, Westford, MA (US); Laura Cornelia Popa, Madison, NJ (US); Michael Judy, Ipswich, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/342,442

(22) Filed: Jun. 8, 2021

(65) Prior Publication Data

US 2021/0380403 A1    Dec. 9, 2021

Related U.S. Application Data

(60) Provisional application No. 63/069,697, filed on Aug. 24, 2020, provisional application No. 63/036,974, filed on Jun. 9, 2020.

(51) Int. Cl.
*B81C 1/00* (2006.01)
*B81B 7/00* (2006.01)

(52) U.S. Cl.
CPC ........ *B81C 1/00325* (2013.01); *B81B 7/0048* (2013.01); *B81C 1/00063* (2013.01); *B81B 2203/01* (2013.01)

(58) Field of Classification Search
CPC . B81B 3/0072; B81B 7/0048; B81C 1/00134; B81C 2203/0785;
(Continued)

(56) References Cited

U.S. PATENT DOCUMENTS 3,839,660 A    10/1974  Stryker
4,492,825 A    1/1985   Brzezinski et al.
(Continued)

FOREIGN PATENT DOCUMENTS

DE    10 2010 042438 A1    7/2011
DE    10 2010 042113 A1    4/2012
(Continued)

OTHER PUBLICATIONS

[No Author Listed], Department of Defense. Test Method Standard Microcircuits, FSC 5962, completed 1997.
(Continued)

*Primary Examiner* — Shahed Ahmed
*Assistant Examiner* — Sun Mi Kim King
(74) *Attorney, Agent, or Firm* — Wolf, Greenfield & Sacks, P.C.

(57) ABSTRACT

A stress-isolated microelectromechanical systems (MEMS) device and a method of manufacture of the stress-isolated MEMS device are provided. MEMS devices may be sensitive to stress and may provide lower performance when subjected to stress. A stress-isolated MEMS device may be manufactured by etching a trench and/or a cavity in a first side of a substrate and subsequently forming a MEMS device on a surface of a platform opposite the first side of the substrate. Such a stress-isolated MEMS device may exhibit better performance than a MEMS device that is not stress-isolated. Moreover, manufacturing the MEMS device by first forming a trench and cavity on a backside of a wafer, before forming the MEMS device on a suspended platform,
(Continued)

provides increased yield and allows for fabrication of smaller parts, in at least some embodiments.

14 Claims, 14 Drawing Sheets

(58) Field of Classification Search
CPC .... B81C 2201/0191; B81C 2201/0194; B81C 1/00325; B81C 2201/01–0105; B81C 2201/0123; B81C 2201/0132; B81C 2201/05–056
See application file for complete search history.

(56) References Cited

U.S. PATENT DOCUMENTS

| | | | |
|---|---|---|---|
| 4,524,247 A | 6/1985 | Lindenberger et al. |
| 4,533,795 A | 8/1985 | Baumhauer, Jr. et al. |
| 4,558,184 A | 12/1985 | Bch-Vishniac et al. |
| 4,710,744 A | 12/1987 | Wamstad |
| 4,740,410 A | 4/1988 | Muller et al. |
| 4,744,863 A | 5/1988 | Guckel et al. |
| 4,776,019 A | 10/1988 | Miyatake |
| 4,800,758 A | 1/1989 | Knecht et al. |
| 4,825,335 A | 4/1989 | Wilner |
| 4,853,669 A | 8/1989 | Guckel et al. |
| 4,872,047 A | 10/1989 | Fister et al. |
| 4,918,032 A | 4/1990 | Jain et al. |
| 4,948,757 A | 8/1990 | Jain et al. |
| 4,996,082 A | 2/1991 | Guckel et al. |
| 5,067,007 A | 11/1991 | Otsuka et al. |
| 5,090,254 A | 2/1992 | Guckel et al. |
| 5,105,258 A | 4/1992 | Silvis et al. |
| 5,113,466 A | 5/1992 | Acarlar et al. |
| 5,146,435 A | 9/1992 | Bernstein |
| 5,172,213 A | 12/1992 | Zimmerman |
| 5,178,015 A | 1/1993 | Loeppert et al. |
| 5,188,983 A | 2/1993 | Guckel et al. |
| 5,207,102 A | 5/1993 | Takahashi et al. |
| 5,241,133 A | 8/1993 | Mullen, III et al. |
| 5,273,939 A | 12/1993 | Becker et al. |
| 5,303,210 A | 4/1994 | Bernstein |
| 5,314,572 A | 5/1994 | Core et al. |
| 5,315,155 A | 5/1994 | O'Donnelly et al. |
| 5,317,107 A | 5/1994 | Osorio |
| 5,336,928 A | 8/1994 | Neugebauer et al. |
| 5,452,268 A | 9/1995 | Bernstein |
| 5,468,999 A | 11/1995 | Lin et al. |
| 5,490,220 A | 2/1996 | Loeppert |
| 5,515,732 A | 5/1996 | Willcox et al. |
| 5,593,926 A | 1/1997 | Fujihira |
| 5,596,222 A | 1/1997 | Bernstein |
| 5,608,265 A | 3/1997 | Kitano et al. |
| 5,629,566 A | 5/1997 | Doi et al. |
| 5,633,552 A | 5/1997 | Lee et al. |
| 5,658,710 A | 8/1997 | Neukermans |
| 5,684,324 A | 11/1997 | Bernstein |
| 5,692,060 A | 11/1997 | Wickstrom |
| 5,740,261 A | 4/1998 | Loeppert et al. |
| 5,828,127 A | 10/1998 | Yamagata et al. |
| 5,870,482 A | 2/1999 | Loeppert et al. |
| 5,901,046 A | 5/1999 | Ohta et al. |
| 5,923,995 A | 7/1999 | Kao et al. |
| 5,939,633 A | 8/1999 | Judy |
| 5,945,605 A | 8/1999 | Julian et al. |
| 5,956,292 A | 9/1999 | Bernstein |
| 5,960,093 A | 9/1999 | Miller |
| 5,994,161 A | 11/1999 | Bitko et al. |
| 6,084,292 A | 7/2000 | Shinohara |
| 6,128,961 A | 10/2000 | Haronian |
| 6,169,328 B1 | 1/2001 | Mitchell et al. |
| 6,243,474 B1 | 6/2001 | Tai et al. |
| 6,249,075 B1 | 6/2001 | Bishop et al. |
| 6,309,915 B1 | 10/2001 | Distefano |
| 6,329,706 B1 | 12/2001 | Nam |
| 6,384,472 B1 | 5/2002 | Huang |
| 6,384,473 B1 | 5/2002 | Peterson et al. |
| 6,401,545 B1 | 6/2002 | Monk et al. |
| 6,433,401 B1 | 8/2002 | Clark et al. |
| 6,505,511 B1 | 1/2003 | Geen et al. |
| 6,522,762 B1 | 2/2003 | Mullenborn et al. |
| 6,535,460 B2 | 3/2003 | Loeppert et al. |
| 6,548,895 B1 | 4/2003 | Benavides et al. |
| 6,552,469 B1 | 4/2003 | Pederson et al. |
| 6,617,683 B2 | 9/2003 | Lebonheur et al. |
| 6,667,189 B1 | 12/2003 | Wang et al. |
| 6,667,557 B2 | 12/2003 | Alcoe et al. |
| 6,677,176 B2 | 1/2004 | Wong et al. |
| 6,704,427 B2 | 3/2004 | Kearey |
| 6,711,317 B2 | 3/2004 | Jin et al. |
| 6,731,180 B1 | 5/2004 | Clark et al. |
| 6,732,588 B1 | 5/2004 | Mullenborn et al. |
| 6,741,709 B2 | 5/2004 | Kay et al. |
| 6,753,583 B2 | 6/2004 | Stoffel et al. |
| 6,768,196 B2 | 7/2004 | Harney et al. |
| 6,781,231 B2 | 8/2004 | Minervini |
| 6,812,620 B2 | 11/2004 | Scheeper et al. |
| 6,816,301 B1 | 11/2004 | Schiller |
| 6,821,819 B1 | 11/2004 | Benavides |
| 6,829,131 B1 | 12/2004 | Loeb et al. |
| 6,847,090 B2 | 1/2005 | Loeppert |
| 6,857,312 B2 | 2/2005 | Choe et al. |
| 6,859,542 B2 | 2/2005 | Johannsen et al. |
| 6,892,575 B2 | 5/2005 | Nasiri et al. |
| 6,914,992 B1 | 7/2005 | van Halteren et al. |
| 6,955,988 B2 | 10/2005 | Nevin et al. |
| 6,984,886 B2 | 1/2006 | Ahn et al. |
| 7,066,004 B1 | 6/2006 | Kohler |
| 7,088,032 B2 | 8/2006 | Oita et al. |
| 7,166,911 B2 | 1/2007 | Karpman et al. |
| 7,215,213 B2 | 5/2007 | Mescher et al. |
| 7,223,624 B2 | 5/2007 | Wu et al. |
| 7,268,463 B2 | 9/2007 | Li et al. |
| 7,309,865 B2 | 12/2007 | Ikushima et al. |
| 7,551,048 B2 | 6/2009 | Iwata et al. |
| 7,839,052 B2 | 11/2010 | Wu et al. |
| 7,871,865 B2 | 1/2011 | Sengupta et al. |
| 8,049,326 B2 | 11/2011 | Najafi et al. |
| 8,103,027 B2 | 1/2012 | Zhang et al. |
| 8,217,474 B2 | 7/2012 | Lee et al. |
| 8,344,487 B2 | 1/2013 | Zhang et al. |
| 8,418,554 B2 | 4/2013 | Joyce |
| 8,476,737 B2 | 7/2013 | Najafi et al. |
| 8,643,125 B2 | 2/2014 | Chen et al. |
| 8,671,752 B2 | 3/2014 | Hoefer et al. |
| 8,698,292 B2 | 4/2014 | Najafi et al. |
| 8,906,730 B2 | 12/2014 | Graham et al. |
| 9,010,190 B2 | 4/2015 | Potasek et al. |
| 9,184,138 B2 | 11/2015 | Merassi et al. |
| 9,227,835 B2 | 1/2016 | Horning et al. |
| 9,250,262 B1 | 2/2016 | Desai et al. |
| 9,422,156 B2 | 8/2016 | Smeys |
| 9,446,940 B2 | 9/2016 | Dawson et al. |
| 9,650,237 B2 | 5/2017 | Ocak et al. |
| 9,670,057 B1 * | 6/2017 | Oldsen ............... B81B 7/0048 |
| 9,676,614 B2 | 6/2017 | Johari-Galle et al. |
| 9,716,015 B2 | 7/2017 | Bieselt |
| 9,975,756 B2 * | 5/2018 | Duqi ................. B81B 3/0086 |
| 9,995,762 B2 | 6/2018 | Hayashi et al. |
| 10,017,375 B2 | 7/2018 | Reichenbach et al. |
| 10,060,820 B2 | 8/2018 | Chen et al. |
| 10,071,905 B2 | 9/2018 | Chu et al. |
| 10,131,538 B2 | 11/2018 | Kaanta et al. |
| 10,167,189 B2 | 1/2019 | Zhang et al. |
| 10,301,171 B1 | 5/2019 | Chakravarty et al. |
| 10,759,659 B2 | 9/2020 | Zhang et al. |
| 2001/0055836 A1 | 12/2001 | Kunda |
| 2002/0102004 A1 | 8/2002 | Minervini |
| 2002/0125208 A1 | 9/2002 | Christenson et al. |
| 2002/0125559 A1 | 9/2002 | Mclellan |
| 2003/0016839 A1 | 1/2003 | Loeppert et al. |
| 2003/0133588 A1 | 7/2003 | Pedersen |
| 2003/0189222 A1 | 10/2003 | Itou et al. |
| 2004/0041254 A1 | 3/2004 | Long et al. |

(56) References Cited

U.S. PATENT DOCUMENTS

| | | |
|---|---|---|
| 2004/0056337 A1 | 3/2004 | Hasebe et al. |
| 2004/0070056 A1 | 4/2004 | Matsuzawa et al. |
| 2004/0179705 A1 | 9/2004 | Wang et al. |
| 2004/0184632 A1 | 9/2004 | Minervini |
| 2004/0184633 A1 | 9/2004 | Kay et al. |
| 2004/0262781 A1 | 12/2004 | Germain et al. |
| 2005/0005421 A1 | 1/2005 | Wang et al. |
| 2005/0018864 A1 | 1/2005 | Minervini |
| 2005/0089188 A1 | 4/2005 | Feng |
| 2005/0093117 A1 | 5/2005 | Masuda et al. |
| 2005/0178208 A1 | 8/2005 | Benzel et al. |
| 2006/0246630 A1 | 11/2006 | Sunohara et al. |
| 2007/0040231 A1 | 2/2007 | Harney et al. |
| 2007/0042521 A1 | 2/2007 | Yama |
| 2008/0290430 A1 | 11/2008 | Mahadevan et al. |
| 2011/0127623 A1 | 6/2011 | Fueldner et al. |
| 2011/0165717 A1 | 7/2011 | Lee et al. |
| 2012/0049298 A1 | 3/2012 | Schlarmann et al. |
| 2012/0068278 A1 | 3/2012 | Knipe et al. |
| 2012/0248552 A1 | 10/2012 | Benzel |
| 2012/0264250 A1 | 10/2012 | Graham et al. |
| 2014/0217521 A1 | 8/2014 | Johari-Galle et al. |
| 2014/0339656 A1 | 11/2014 | Schlarmann |
| 2014/0353772 A1 | 12/2014 | Stermer |
| 2015/0197419 A1 | 7/2015 | Cheng et al. |
| 2016/0090297 A1 | 3/2016 | Zhang et al. |
| 2016/0159641 A1 | 6/2016 | Najafi et al. |
| 2016/0229688 A1 | 8/2016 | Gu et al. |
| 2017/0030788 A1 | 2/2017 | Boysel et al. |
| 2017/0073218 A1 | 3/2017 | Kaanta et al. |
| 2017/0122976 A1 | 5/2017 | Mitchell et al. |
| 2018/0230005 A1 | 8/2018 | Lee et al. |
| 2018/0299335 A1 | 10/2018 | Wong et al. |
| 2019/0031499 A1 | 1/2019 | Pregl et al. |
| 2019/0047846 A1 | 2/2019 | Zhang et al. |
| 2019/0161346 A1 | 5/2019 | Lee et al. |

FOREIGN PATENT DOCUMENTS

| | | |
|---|---|---|
| EP | 0 788 157 A2 | 6/1997 |
| JP | 60-077434 A | 5/1985 |
| JP | 62-241355 A | 10/1987 |
| JP | 05-226501 A | 9/1993 |
| JP | 07-142518 A | 6/1995 |
| JP | 08-116007 A | 4/1996 |
| WO | WO 83/01362 A1 | 4/1983 |
| WO | WO 91/05368 A1 | 4/1991 |
| WO | WO 01/20948 A2 | 3/2001 |
| WO | WO 02/45463 A2 | 6/2002 |
| WO | WO 2004/022477 A1 | 3/2004 |
| WO | WO 2005/036698 A2 | 4/2005 |
| WO | WO 2007/030345 A2 | 3/2007 |
| WO | WO 2012/037537 A2 | 3/2012 |
| WO | WO 2016/112463 A1 | 7/2016 |

OTHER PUBLICATIONS

[No Author Listed], Electret Condenser Microphone Cartridge Preamplifier, Maxim Integrated Products, Jul. 2002, 9 pages.

[No Author Listed], Liquid Crystal Polymer (LCP) Air Cavity Packages, Quantum Leap Packaging, Inc., Brochure, 2004, 2 pages.

[No Author Listed], Microphone industry to expand MEMS-based offerings, The Information Network, online <www.theinformationnet.com>, printed Feb. 1, 2005, Nov. 14, 2003, 2 pages.

[No Author Listed], Phone-Or/Technology, online <file://C:\Documents%20and%20Settings\bmansfield\Local%20Settings\Temporary%20Internet%20Files\OLKE\Phone-Or%20% . . . >, printed Feb. 1, 2005, 2 pages.

[No Author Listed], The Prismark Wireless Technology Report—Mar. 2005. Prismark Partners LLC; www.prismark.com, pp. 1-44.

Bajdechi et al., Single-Chip Low-Voltage Analog-to-Digital Interface for Encapsulation with Electret Microphone, The 11th International Conference on Solid-State Sensors and Actuators, Jun. 10-14, 2001, 4 pages.

Bernstein et al., High Sensitivity MEMS Ultrasound Arrays by Lateral Ferroelectric Polarization, Solid-State Sensor and Actuator Workshop, Jun. 4-8, 2000, 4 pages.

Bernstein, MEMS Air Acoustics Research The Charles Stark Draper Laboratory, PowerPoint Presentation, Aug. 1999, 8 pages.

Blackwell, The Electronic Packaging Handbook, CRC Press LLC, pp. 2-3, 7-1, 7-12, A-9, and A-11, 2000.

Brown, Advanced Electronic Packaging with Emphasis on Multichip Modules, Institute of Electrical and Electronics Engineers, Inc., pp. 4-8, 568, 1999.

Chen et al., Single-Chip Condenser Miniature Microphone with a High Sensitive Circular Corrugated Diaphragm, IEEE, 2002, 4 pages.

Cunningham et al., Wide bandwidth silicon nitride membrane microphones, SPIE vol. 3223, Sep. 1997, 9 pages.

Fan et al., Development of Artificial Lateral-Line Flow Sensors, Solid-State Sensor, Actuator and Microsystems Workshop, Jun. 2-6, 2002, 4 pages.

Fuldner et al., Silicon Microphones with Low Stress Membranes, The 11th International Conference on Solid-State Sensors and Actuators, Jun. 10-14, 2001, 4 pages.

Gale et al., MEMS Packaging, University of Utah, Microsystems Principles, PowerPoint Presentation, Oct. 11, 2001, 8 pages.

Hall et al., Self-Calibrating Micromachined Microphones with Integrated Optical Displacement Detection, The 11th International Conference on Solid State Sensors and Actuators, Jun. 10-14, 2001, 4 pages.

Harper (Editor-in-Chief), Electronic Packaging and Interconnection Handbook, Third Edition, McGraw-Hill, Chapter 7, Section 7.2.3.1, 2000, 7 pages.

Heuberger, Mikromechanik, Springer Verlang A.G., pp. 470-476, 1989 (With translation).

Hsieh et al., A Micromachined Thin-film Teflon Electret Microphone, Department of Electrical Engineering California Institute of Technology, 1997, 4 pages.

Judy, "Microelectromechanical systems (MEMS): fabrication, design and applications", Electrical Engineering Department, Institute of Physics Publishing, Smart Materials and Structures, vol. 10, pp. 1115-1134 Nov. 26, 2001.

Kabir et al., High Sensitivity Acoustic Transducers with Thin P+ Membranes and Gold Back-Plate, Sensors and Actuators, vol. 78, Issue 2-3, Dec. 17, 1999, 17 pages.

Ko et al., Piezoelectric Membrane Acoustic Devices, IEEE, 2002, 4 pages.

Kopola et al., MEMS Sensor Packaging Using LTCC Substrate Technology, VTT Electronics, Proceedings of SPIE vol. 4592, 2001, pp. 148-158.

Lee et al., Cavity-Enhanced Sacrificial Layer Micromachining for Faster Release of Thin Film Encapsulated MEMS. Iopscience. May 15, 2015; 25(6):1-8.

Luoto et al., MEMS on Cavity-SOI Wafers. Science Direct. Feb. 2007; 51(2):328-332.

Ma et al., Design and Fabrication of an Integrated Programmable Floating-Gate Microphone, IEEE, 2002, 4 pages.

Mason, Companies Compete To Be Heard On the Increasingly Noisy MEMS Phone Market, Small Times: News about MEMS, Nanotechnology and Microsystems, Jul. 18, 2003, 4 pages.

Mori, Silicon-on-Insulator (SOI) Technology for Micro-Electromechanical Systems (MEMS) and Nano-Electromechanical Systems (NEMS) Sensors. Institute of Microelectronics. Singapore. Jun. 27, 2014; 19 pages.

Neumann et al., A Fully-Integrated CMOS-MEMS Audio Microphone, The 12th International Conference on Solid State Sensors, Actuators and Microsystems Jun. 8-12, 2003, 4 pages.

Ono et al., Design and Experiments of Bio-mimicry Sound Source Localization Sensor with Gimbal-Supported Circular Diaphragm, The 12th International Conference on Solid State Sensors, Actuators and Microsystems, Jun. 8-12, 2003, 4 pages.

Pecht, Handbook of Electronic Package Design, Marcel Dekker, Inc. pp. 173, 179, 196, 210, 736, 744, 821 and 832, 1991.

(56) References Cited

OTHER PUBLICATIONS

Pedersen et al., A Polymer Condenser Microphone on Silicon with On-Chip CMOS Amplifier, Solid State Sensors and Actuators, 1997, 3 pages.
Rugg et al., Thermal Package Enhancement Improves Hard Disk Drive Data Transfer Performance, Pan Pacific Microelectronics Symposium, Proceedings of the Technical Program, Island of Maui, Hawaii, Feb. 5-7, 2002, pp. 451-456.
Schafer et al., Micromachined Condenser Microphone for Hearing Aid Use, Solid-State Sensor and Actuator Workshop, Jun. 8-11, 1998, 4 pages.
Sheplak et al., A Wafer-Bonded, Silicon-Nitride Membrane Microphone with Dielectrically-Isolated, Single-Crystal Silicon Piezoresistors, Solid-State Sensor and Actuator Workshop, Jun. 8-11, 1998, 4 pages.
Stahl et al., Thin Film Encapsulation of Acceleration Sensors Using Polysilicon Sacrificial Layer, Transducers '03, The 12$^{th}$ International Conference on Solid State Sensors, Actuators and Microsystems, Jun. 8-12, 2003, 4 pages.
Tilmans et al., The indent reflow sealing (IRS) technique—a method for the fabrication of sealed cavities for MEMS devices. IEEE Journal of Microelectro-mechanical Systems. 2000; 9(2):206-217.
Torunbalci et al., A Method for Wafer Level Hermetic Packaging of SOI-MEMS Devices with Embedded Vertical Feedthroughs Using Advanced MEMS Process. Journal of Micromechanics and Microengineerng. Nov. 18, 2015; 25: 11 pages.
Tummula et al., Microelectronics Packaging Handbook, Semiconductor Packaging Part II, Second Edition, Chapman & Hall, pp. 11-12, 1997.
Weigold et al., A MEMS Condenser Microphone for Consumer Applications, Analog Devices, Inc. and Pixtronix, Inc., Jan. 2006, 4 pages.
Yovcheva et al., Investigation on Surface Potential Decay in PP Corona Electrets, BPU-5: Fifth General Conference of the Balkan Physical Union, Aug. 25-29, 2003, 4 pages.
Zhuang et al., Integration of Trench-Isolated Through-Wafer Interconnects with 2d Capacitive Micromachined Ultrasonic Transducer Arrays. ScienceDirect. Sensors and Actuators A. Apr. 19, 2007; 138: 221-229.
Zou et al., A Novel Integrated Silicon Capacitive Microphone—Floating Electrode "Electret" Microphone (FEEM), Journal of Microelectromechanical Systems, vol. 7, No. 2, Jun. 1998, 11 pages.
Final Office Action, U.S. Appl. No. 13/757,217, 10 pages, dated Feb. 27, 2015.
Non Final Office Action, U.S. Appl. No. 13/757,217, 20 pages, dated Jul. 2, 2014 [2550/E20].
Response to Office Action of Jul. 2, 2014—U.S. Appl. No. 13/757,217, filed Dec. 20, 2014, 29 pages.
Request for Continued Examination (RCE)—U.S. Appl. No. 13/757,217, filed Aug. 27, 2015, 13 pages.
Response to Notice of Non-Compliant Amendment of Mar. 11, 2016—U.S. Appl. No. 13/757,217, filed Jun. 17, 2016, 8 pages.
Office Action—U.S. Appl. No. 13/757,217, dated Jun. 27, 2016, 30 pages.

\* cited by examiner

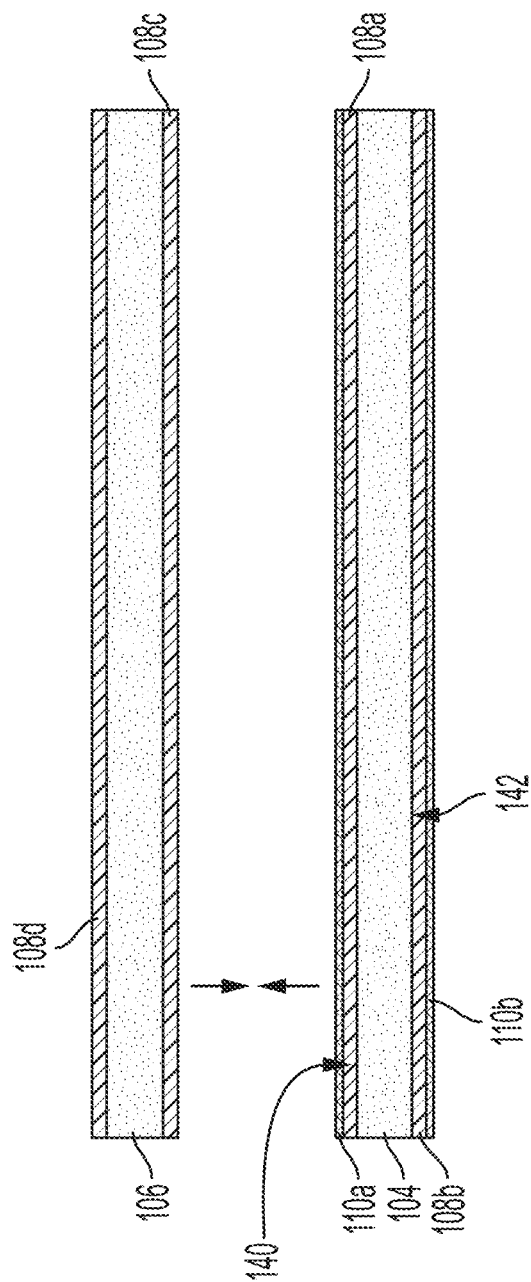

STRESS-ISOLATED MEMS DEVICE COMPRISING SUBSTRATE HAVING CAVITY AND METHOD OF MANUFACTURE

RELATED APPLICATIONS

This Application claims the benefit under 35 USC 119(e) of U.S. Application Ser. No. 63/069,697, filed Aug. 24, 2020, and entitled "STRESS-ISOLATED MEMS DEVICE COMPRISING SUBSTRATE HAVING CAVITY AND METHOD OF MANUFACTURE", which is incorporated by reference herein in its entirety.

This Application claims the benefit under 35 USC 119(e) of U.S. Application Ser. No. 63/036,974, filed Jun. 9, 2020, and entitled "STRESS-ISOLATED MEMS DEVICE COMPRISING SUBSTRATE HAVING CAVITY", which is incorporated by reference herein in its entirety.

FIELD OF THE DISCLOSURE

The present disclosure relates to stress-sensitive microscale devices, such as sensors.

BACKGROUND

There are various types of microelectromechanical systems (MEMS) devices. Some MEMS devices comprise sensors, for example, gyroscopes, accelerometers, or pressure sensors.

MEMS devices may be sensitive to stress. For example, when there is a stress in a substrate upon which a MEMS sensor is disposed, the MEMS sensor may provide different performance and/or output than if there was not a stress in the substrate.

SUMMARY OF THE DISCLOSURE

A stress-isolated microelectromechanical systems (MEMS) device and a method of manufacture of the stress-isolated MEMS device are provided. MEMS devices may be sensitive to stress and may provide lower performance when subjected to stress. A stress-isolated MEMS device may be manufactured by etching a trench and/or a cavity in a first side of a substrate and subsequently forming a MEMS device on a surface of a platform opposite the first side of the substrate. Such a stress-isolated MEMS device may exhibit better performance than a MEMS device that is not stress-isolated. Moreover, manufacturing the MEMS device by first forming a trench and cavity on a backside of a wafer, before forming the MEMS device on a suspended platform, provides increased yield and allows for fabrication of smaller parts, in at least some embodiments.

According to some aspects of the present application, a method of manufacture of a stress-isolated microelectromechanical systems (MEMS) device is provided. The method comprises providing a substrate having a first side and a second side opposite the first side, etching a trench in the first side of the substrate, forming a platform adjacent to and substantially surrounded by the trench, and forming a MEMS device on a surface of the platform opposite the first side of the substrate.

In some embodiments, etching the trench comprises defining a plurality of tethers at locations configured to connect the platform to a periphery of the substrate.

In some embodiments, forming the MEMS device on the surface of the platform comprises forming the MEMS device to include a movable sensing mass having a thickness of approximately 8 microns or greater.

In some embodiments, forming the platform further comprises etching a cavity in the first side of the substrate prior to etching the trench, and forming the trench such that the cavity laterally extends at least to the trench.

In some embodiments, the method further comprises etching the cavity to a first depth and etching the trench to a second depth greater than the first depth.

In some embodiments, the substrate comprises a first substrate, and the method further comprises, after etching the trench and after etching the cavity, bonding a second substrate to the first substrate, over the cavity and the trench, to form a sealed cavity. In some such embodiments, the method further comprises thinning the second substrate such that the stress-isolated MEMS device has a thickness of less than approximately 500 microns.

According to some aspects of the present disclosure, a stress-isolated microelectromechanical systems (MEMS) device is provided. The stress-isolated MEMS device comprises a substrate, a suspended platform defined at least in part within the substrate, and a MEMS device disposed on the suspended platform, wherein the MEMS device and suspended platform have a combined thickness of less than approximately 500 microns. Achieving such small dimensions may be facilitated by the methods described herein for forming a stress-isolated MEMS device.

In some embodiments, the MEMS device comprises a movable sensing mass having a thickness of approximately 8 microns or greater.

In some embodiments, the stress-isolated MEMS device further comprises a plurality of tethers connecting the suspended platform to a peripheral region of the substrate, and further comprises an electrical connection between the suspended platform and the peripheral region that does not align with any of the plurality of tethers. In some such embodiments, the electrical connection is formed of polysilicon.

In some embodiments, the stress-isolated MEMS device further comprises a cavity formed under the suspended platform, the substrate comprises a first substrate, and the stress-isolated MEMS device further comprises a second substrate bonded to the first substrate such that the cavity is disposed between the suspended platform and the second substrate.

In some embodiments, the stress-isolated MEMS device further comprises a trench encircling the platform.

According to some aspects of the present disclosure, there is provided a method of forming a stress-isolated microelectromechanical systems (MEMS) device. The method comprises defining a suspended platform at least in part by backside etching a wafer, the backside etching defining a plurality of tethers positioned to connect the suspended platform to a peripheral region and forming the MEMS device on a front side of the suspended platform.

In some embodiments, backside etching of the wafer comprises forming a trench in the wafer, and the method further comprises forming a jumper spanning the trench and not aligned with any of the plurality of tethers. In some such embodiments, forming the MEMS device comprises forming a movable sensing mass, and forming the electrical connection comprises forming the electrical connection from a common layer with the movable sensing mass.

In some embodiments, the wafer is a first wafer, and the method comprises bonding the first wafer and a second wafer prior to backside etching the first wafer, removing the second wafer from the first wafer subsequent to backside etching the first wafer, and bonding the first wafer to a third wafer prior to forming the MEMS device on the front side of the suspended platform.

In some embodiments, forming the stress-isolated MEMS device comprises defining a thickness of the MEMS device and of the wafer to be less than 500 microns total.

In some embodiments, the wafer is a first wafer, and the method further comprises bonding a cap wafer to the first wafer.

In some embodiments, backside etching of the wafer comprising a first etch defining a cavity and a second etch defining a trench through a portion of the cavity.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 2A-2E show cross-sectional views of steps of a manufacturing process of a stress-isolated MEMS device;

DETAILED DESCRIPTION

Figure 1:
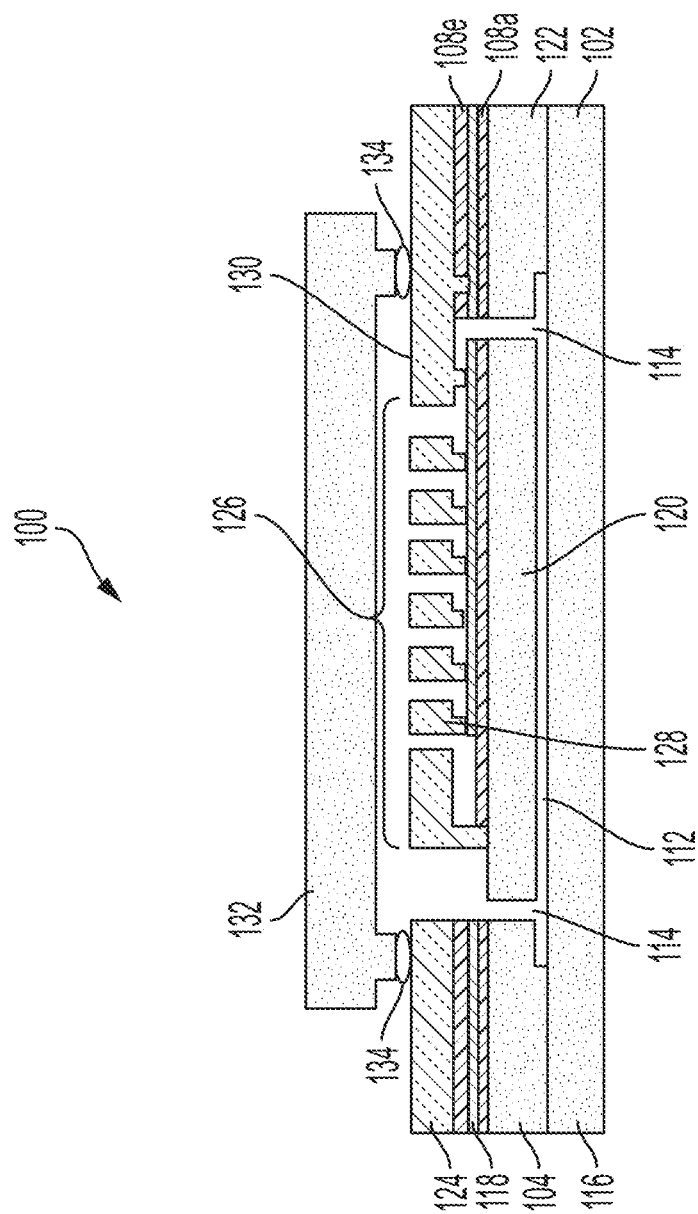
FIG. 1 shows a cross-sectional view of a stress-isolated MEMS device.

According to some aspects of the present disclosure, a stress-isolated MEMS device and a method of manufacture of the stress-isolated MEMS device are provided. The inventors have recognized that MEMS devices may be sensitive to stress so that when there is a stress in a substrate upon which a MEMS device is disposed, the MEMS device may provide different output than if the substrate was not under stress. The inventors have further recognized that a stress-isolated MEMS device may be manufactured by etching a stress-isolation trench and/or a stress-isolation cavity on a backside of a substrate using a backside etch process, sealing the cavity, and then forming a MEMS device on a surface of a platform representing a frontside of the substrate. Such a method of manufacture of a stress-isolated MEMS device may provide various benefits.

According to various aspects of the present disclosure, such a manufacturing process may provide stress-isolated MEMS devices having a greater thickness of MEMS layers (which may result in higher sensitivity of devices), having a smaller overall size (for example, a smaller thickness), and/or having a lower cost. For example, according to some conventional methods of manufacturing a MEMS device, a cavity is not sealed between an isolation substrate and a handle substrate. The inventors have recognized that because a cavity may be sealed between an isolation substrate and a handle substrate, thinning the handle substrate may provide a device having a smaller thickness, which may further allow a greater thickness MEMS, compared to devices manufactured by conventional methods. Furthermore, such a process results in a greater manufacturing yield than alternative approaches, in at least some embodiments.

According to some aspects of the present disclosure, such an improved manufacturing process may also provide greater electrical connectivity for a MEMS device, for example, because a MEMS process is performed after the trench and/or cavity are formed. According to some conventional methods of manufacturing a stress-isolated MEMS device, trenches are etched from a front side of a substrate that the MEMS device is disposed on. In some implementations of such a conventional manufacturing method, jumpers electrically coupling the MEMS device and a peripheral region of the substrate cannot be used, because the jumpers would be etched away when the trenches are etched. Instead, such conventional methods can be reliant on electrical conductors formed on tethers, the tethers coupling the platform to the peripheral region of the substrate. Because the size and number of tethers should be small enough to isolate the platform from the substrate stress, relying on electrical conductors formed on the tethers can severely limit the number of electrical connections that may be made to the MEMS device. The inventors have recognized that forming trenches using a backside etch process may allow jumpers to be formed by a frontside process after the trenches are etched and after the substrate is flipped. These jumpers may provide a greater number of electrical couplings between the MEMS device and the peripheral region of the substrate than if only electrical conductors on tethers were used, thereby increasing the electrical connectivity of the MEMS device.

A MEMS device may be disposed on a substrate. In some implementations, a substrate upon which a MEMS device is disposed may experience stress. In some implementations, a MEMS device, such as a sensor, disposed on a substrate experiencing stress may also experience stress. A MEMS device such as a sensor experiencing stress may exhibit lower performance, for example, reduced accuracy and/or precision. In various implementations, stress that a substrate experiences may comprise packaging stress, thermal stress, and/or other stresses.

The inventors have recognized that it may be advantageous to provide a stress-isolated MEMS device and a method of manufacture of the stress-isolated MEMS device. A stress-isolated MEMS device may reduce or substantially eliminate the lower performance, for example, the reduction in accuracy and/or precision, caused by stress.

According to aspects of the present disclosure a stress-isolated MEMS device may include one or more stress-isolation features. A stress-isolation feature may include a stress-isolation gap, a trench, a cavity, a tether, a jumper or an electrical conductor, among other possibilities.

Such a stress-isolated MEMS device and its stress-isolation features may be formed using a suitable process, including a backside etch to create a cavity above which a platform may be suspended to support the MEMS device. For example, a substrate may be provided. The substrate may have a first side and a second side opposite the first side. A trench and/or a cavity may be etched from the first side of the substrate. The first side represents a backside of the substrate, in at least some embodiments. A platform may be formed adjacent to and/or substantially surrounded by the trench. For example, a suspended platform may be formed at least in part by backside etching a wafer. The backside etching may define a plurality of tethers positioned to connect the suspended platform to a peripheral region, A MEMS device may be formed on a surface of the platform opposite the first side of the substrate. For example, the MEMS device may be formed on a front side of a suspended platform.

FIG. 1 illustrates anon-limiting example of a stress-isolated MEMS device 100 according to an aspect of the present application. As shown, the stress-isolated MEMS device 100 comprises device substrate 102, MEMS layer 124, and a cap 132. Device substrate 102 comprises isolation substrate 104 and handle substrate 116. Device substrate 102 comprises platform 120 and peripheral region 122. Device substrate 102 includes a stress-isolation gap. A stress-isolation gap may comprise cavity 112 and at least one trench 114. A first oxide layer 108a is formed on isolation substrate 104. At least one routing layer 118 (for example, a single layer or two or more layers) is formed on the first oxide layer 108a. An additional oxide layer 108e is formed on the routing layer 118. The MEMS layer 124 may be formed on the additional oxide layer 108e. The MEMS layer 124 comprises MEMS device 126 and a jumper 130. The MEMS device 126 comprises at least one movable beam 128. The cap 132 is bonded to the MEMS layer 124 with cap seal 134.

A method of manufacturing a stress-isolated MEMS device 100 according to some aspects of the present disclosure is provided. Initially, two substrates may be bonded together, representing an isolation substrate and a sacrificial substrate. As shown in the illustrative embodiment of FIG. 2A, an isolation substrate 104 may be provided. In some embodiments, a first oxide layer 108a is formed on a front side 140 of isolation substrate 104 and a second oxide layer 108b is formed on a back side 142 of isolation substrate 104. A first nitride layer 110a may be formed on the first oxide layer 108a and a second nitride layer 110b may be formed on the second oxide layer 108b.

As further shown in the illustrative embodiment of FIG. 2A, a sacrificial substrate 106 may be provided. In some embodiments, a third oxide layer 108c may be formed on a first side of the sacrificial substrate 106 and a fourth oxide layer 108d may be formed on a second side of the sacrificial substrate 106.

In some embodiments, isolation substrate 104 may be bonded to sacrificial substrate 106 and annealed. In some embodiments, isolation substrate 104 may be bonded to sacrificial substrate 106 such that first nitride layer 110a of isolation substrate 104 is bonded to third oxide layer 108c of sacrificial substrate 106.

Figure 2B:
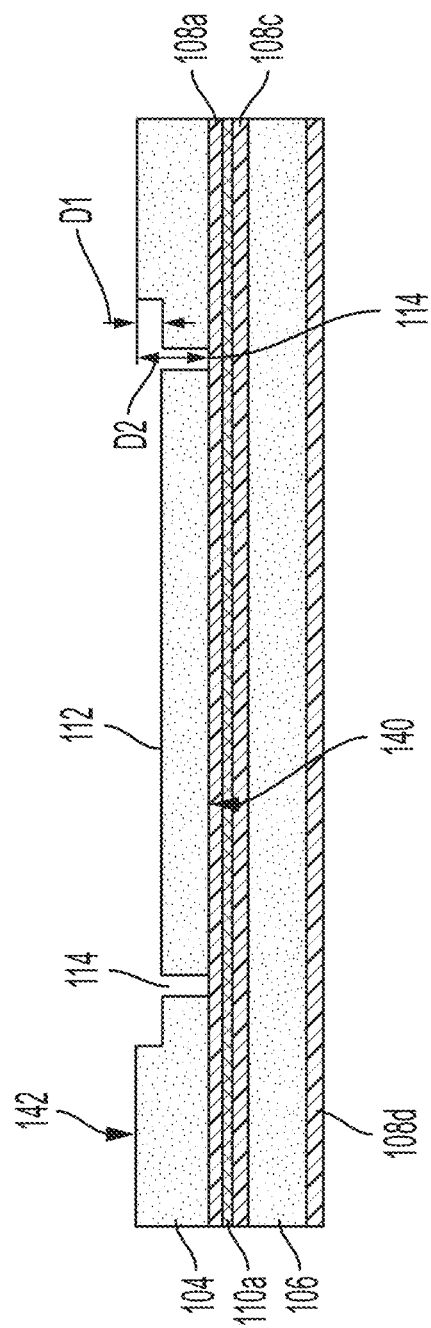

According to aspects of the present disclosure, some steps of the method of manufacture may be performed as backside processes. For example, a trench and/or a cavity may be formed by a backside process. Prior to the step illustrated in FIG. 2B, the second oxide layer 108b and the second nitride layer 110b on the back side 142 of the isolation substrate 104 may be removed (e.g., etched, stripped, or otherwise removed). As shown in the illustrative embodiment of FIG. 2B, a cavity 112 may be formed in isolation substrate 104, for example, by etching. In some embodiments, at least one trench 114 may be formed in isolation substrate 104, for example, by etching. In some embodiments, trench 114 is etched through a portion of cavity 112. In some embodiments, a trench 114 may be formed as a through silicon via (TSV) by patterning and etching the isolation substrate 104. In some embodiments, cavity 112 and at least one trench may be formed on back side 142 of isolation substrate 104. In some embodiments, the cavity 112 may be formed to extend to a first depth D1 into the isolation substrate 104 and the trench may be formed to extend a second depth D2 into isolation substrate 104, where the second depth D2 is greater than the first depth D1. The cavity 112 may laterally extend (for example, extend parallel to the back side 142 of isolation substrate 104) at least to the trench 114. In some embodiments, the cavity 112 may laterally extend beyond the trench 114, for example, as illustrated in FIG. 2B. In some embodiments, trench 114 may be formed to encircle cavity 112. In some embodiments, trench 114 is formed at approximately a perimeter of cavity 112. In some embodiments, such as that shown in FIG. 2B, cavity 112 extends laterally beyond trench 114. Cavity 112 and trench 114 may be formed by etching isolation substrate 104 using a backside etch process.

Figure 2C:
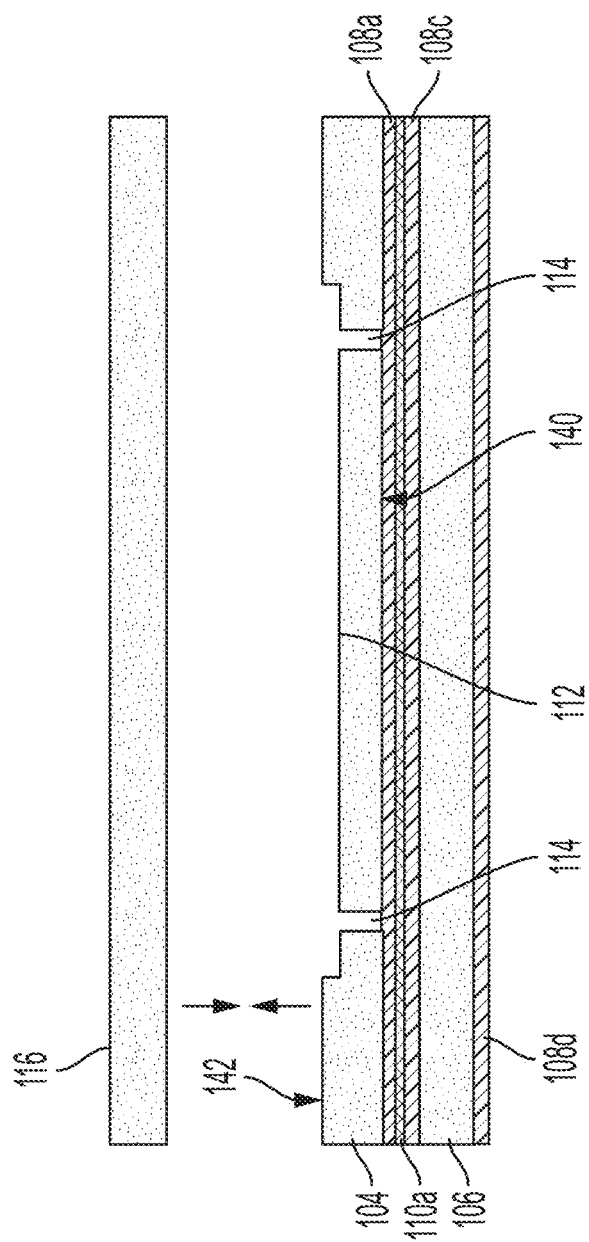

According to aspects of the present disclosure, the cavity formed in the backside of a substrate may be sealed. For example, a cavity may be sealed between an isolation wafer and a handle wafer. As shown in the illustrative embodiment of FIG. 2C, a handle substrate 116 may be provided. In some embodiments, the handle substrate 116 may be bonded to the isolation substrate 104 and annealed. In some embodiments, the handle substrate 116 may be bonded to the isolation substrate 104 over the cavity 112 and the at least one trench 114, and may seal the cavity 112 and/or trench 114. The handle substrate 116 may be formed of silicon or any other suitable material to serve as a handle.

Figure 2D:
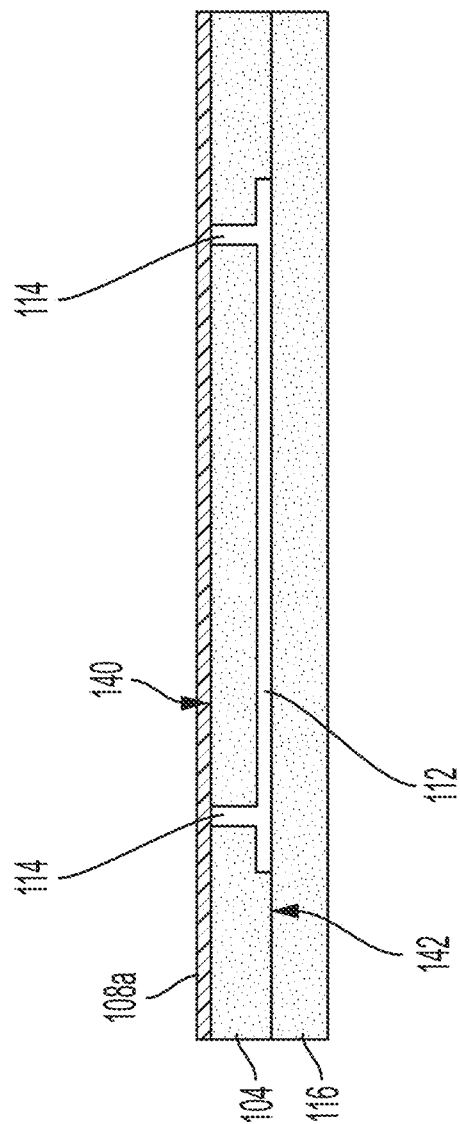

According to aspects of the present disclosure, further processing may be on the frontside of the structure. For example, the backside processing may conclude, the substrate may be flipped, and further processing may proceed with frontside processes. As shown in the illustrative embodiment of FIG. 2D, the isolation substrate 104 and handle substrate 116 may be flipped. In some embodiments, the sacrificial substrate 106, and its third oxide layer 108c and fourth oxide layer 108d may be removed. In some embodiments, the remaining first nitride layer 110a of the isolation layer 104 may be removed, etching the isolation substrate 104 down to first oxide layer 108a. In some embodiments, the first nitride layer 110a may be removed with hot phosphoric acid.

Figure 2E:
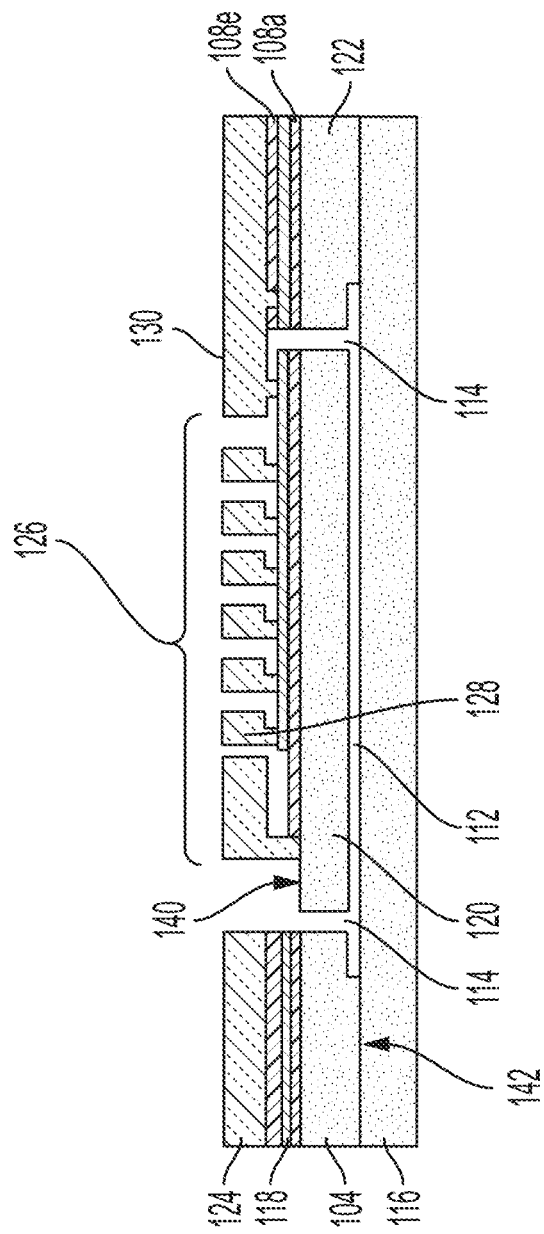

According to aspects of the present disclosure, after a substrate has a trench and/or cavity formed by a backside etch process and has been flipped, MEMS-only processing may ensue. A MEMS-only process may comprise forming a MEMS device and/or forming jumpers that couple the MEMS device with a peripheral region of the substrate, and may use polysilicon. FIG. 2E may depicts the result of a MEMS-only process. In some embodiments, the MEMS process is performed on a side of the isolation substrate 104 opposite the side of isolation substrate 104 upon which cavity 112 and trench 114 are formed using the backside etch process. For example, a MEMS process may be performed on front side 140 of isolation substrate 104. As shown in the illustrative embodiment of FIG. 2E, at least one routing layer 118 may be patterned and formed on isolation substrate 104, for example, on the first oxide layer 108a of isolation substrate 104. In some embodiments, there may be a single routing layer, while in other embodiments, there may be two or more routing layers. In some embodiments, an additional oxide layer 108e may be patterned and formed on the routing layer 118. In some embodiments, a MEMS layer 124 may be patterned and formed on isolation substrate 104, for example, on the additional oxide layer 108e. The MEMS layer 124 may be patterned and formed to include a MEMS device 126 on platform 120 and a jumper extending across a trench 114, from the platform 120 to the peripheral region 122. The MEMS layer 124 may be patterned and formed such that MEMS device 126 includes at least one movable beam 128. MEMS layer 124 may be released, for example, by hydrogen fluoride vapor etching. The portions of first oxide layer 108a and additional oxide layer 108e extending across a trench 114 may be removed, for example, by hydrogen fluoride vapor etching. Performing the MEMS process on the side of the isolation substrate 104 opposite the side of isolation substrate upon which cavity 112 and trench 114 are formed using the backside etch process may allow jumpers 130 to be formed after trench 114 is etched. In embodiments where a backside etch is not used to form cavity 112 and trench 114, it may not be possible to form jumpers 130.

According to aspects of the present disclosure, MEMS device 126 may be sealed in the stress isolated MEMS device 100. For example, as shown in the illustrative embodiment of FIG. 1, a cap 132 may be bonded to the MEMS layer 124. In some embodiments, the cap 132 may be bonded to the MEMS layer 124 using cap seal 134. The cap 132 may seal the cavity 112 and the at least one trench 114.

According to aspects of the present disclosure, device size may be reduced by use of the fabrication methodology described herein. In some embodiments, device substrate 102 may be thinned, for by etching device substrate 102 opposite the side of the device substrate 102 upon which the MEMS device 126 is disposed. Thinning device substrate 102 may form a smaller device, and/or may allow a greater thickness of MEMS layer 124, which may provide enhanced performance of MEMS device 126. For example, when implementing a thinner device substrate, a thicker MEMS layer may be incorporated while maintaining a same overall thickness. In some embodiments, a thicker MEMS layer may provide larger movable beams and/or larger capacitive sensing elements. Larger movable beams or larger sensing elements may react more accurately or precisely to a measured parameter (for example, acceleration), thereby providing greater sensor performance (for example, greater resolution).

Figure 3:
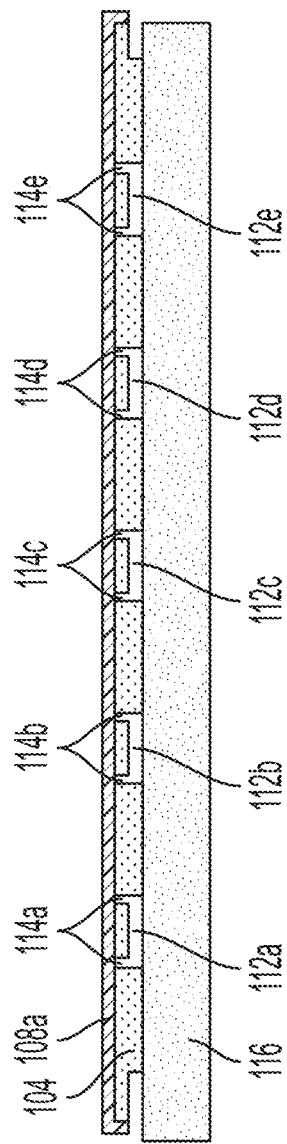
FIG. 3 shows a cross-sectional view of a step of a manufacturing process of multiple stress-isolated devices.

According to an aspect of the present application, multiple stress-isolated MEMS devices of the types described herein may be manufactured at once by wafer-level processing. For example, the steps of FIGS. 2A-2E may be performed at the wafer level, with the substrates of those figures being wafers. As a non-limiting example, the step of manufacture illustrated in FIG. 3 corresponds to the step of manufacture shown in FIG. 2D, except that FIG. 3 shows the formation of five separate, sealed cavities which may correspond to five, respective stress-isolated MEMS devices. Cavity 112a and at least one trench 114a correspond to a first stress-isolated MEMS device, cavity 112b and at least one trench 114b correspond to a second stress-isolated MEMS device, cavity 112c and at least one trench 114c correspond to a third stress-isolated MEMS device, cavity 112d and at least one trench 114d correspond to a fourth stress-isolated MEMS device, and cavity 112e and at least one trench 114e correspond to a fifth stress-isolated MEMS device. Thus, in this non-limiting illustration, it can be seen that multiple instances of the MEMS device may be manufactured at the same time at the wafer level. In other embodiments, any number of stress-isolated MEMS devices may be manufactured at one time. The devices may subsequently be diced to obtain individual stress-isolated MEMS devices.

As illustrated in FIG. 3, isolation substrate 104 may comprise a portion of an isolation wafer, and handle substrate 116 may comprise a portion of a handle wafer. While not illustrated in FIG. 3, sacrificial substrate 106 may comprise a portion of a sacrificial wafer and cap 132 may comprise a portion of a cap wafer.

Figure 4:
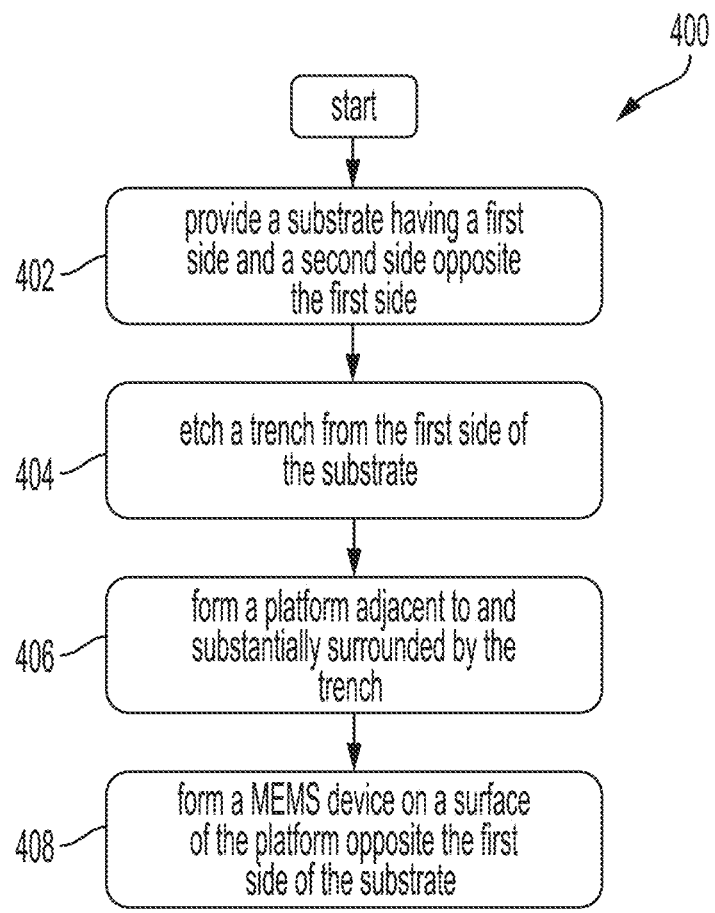
FIG. 4 shows a process flow of a method of manufacture of a stress-isolated MEMS device.

FIG. 4 is a flowchart of an illustrative method 400 of manufacture of a stress-isolated MEMS device according to an aspect of the present application. The method 400 is consistent with the fabrication sequence of FIGS. 2A-2E and comprises step 402, step 404, step 406, and step 408. Step 402 comprises providing a substrate having a first side and a second side opposite the first side, for example, as shown in FIGS. 2A and 2B. Step 404 comprises etching a trench from the first side of the substrate, for example, as shown in FIG. 2B. Step 406 comprises forming a platform adjacent to and substantially surrounded by the trench, for example as shown in FIGS. 2B, 2C, 2D, and 2E. Step 408 comprises forming a MEMS device on a surface of the platform opposite the first side of the substrate, for example, as shown in FIG. 2E.

Figure 5:
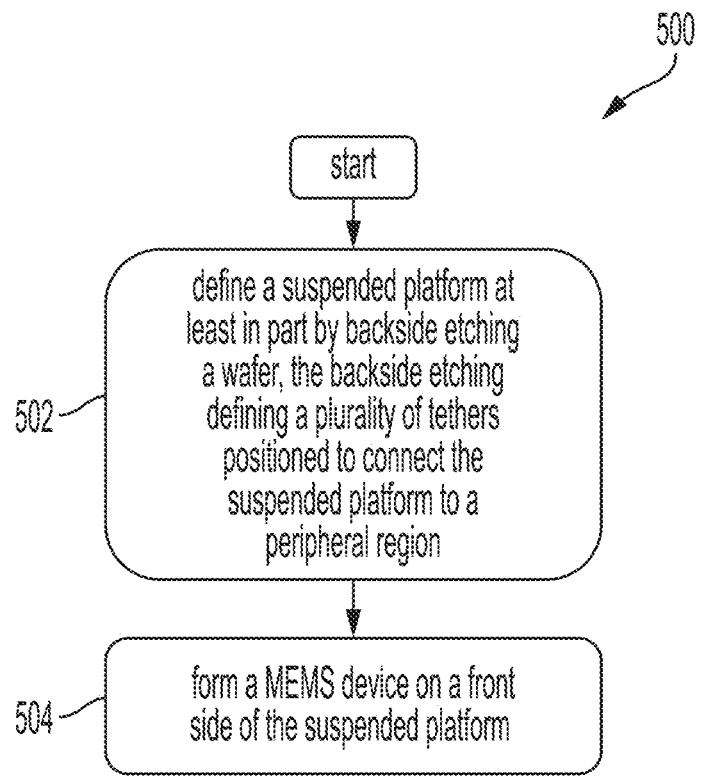
FIG. 5 shows a process flow of a method of manufacture of a stress-isolated MEMS device.

FIG. 5 shows an illustrative method of forming a stress-isolated MEMS device, comprising step 502 and step 504. Step 502 comprises defining a suspended platform at least in part by backside etching a wafer, the backside etching defining a plurality of tethers positioned to connect the suspended platform to a peripheral region, for example, as illustrated in FIGS. 2B, 2C, 2D, and 2E. Step 504 comprises forming the MEMS device on a front side of the suspended platform, for example, as shown in FIG. 2E.

In some embodiments, stress-isolated MEMS device 100 may comprise a stress-isolated sensor, such as a stress-isolated gyroscope, a stress-isolated accelerometer, a stress-isolated pressure sensor, or another stress-isolated sensor. For example, MEMS device 126 may comprise a sensor such as a gyroscope, accelerometer, pressure sensor, or other sensor. Movable beam 128 may comprise a movable portion of such a gyroscope, accelerometer, pressure sensor or other sensor. For example, movable beam 128 may comprise a movable sensing mass. For example, in an embodiment where stress-isolated MEMS device 100 comprises a stress-isolated accelerometer, MEMS device 126 may comprise an accelerometer and movable beam 128 may be configured to move in response to an acceleration applied to the stress-isolated MEMS device 100. Other elements of the MEMS device 126 may sense the movement of movable beam 128 and an acceleration of the stress-isolated MEMS device 100 may be determined. For example, the movement of movable beam 128 may be sensed by sensing a change in capacitance between movable beam 128 and another element of MEMS device 126.

In some embodiments, stress-isolated MEMS device 100 may have a thickness of approximately 800 microns, less than approximately 800 microns, approximately 700 microns, less than approximately 700 microns, approximately 600 microns, less than approximately 600 microns, approximately 500 microns, less than approximately 500 microns, approximately 400 microns, less than approximately 400 microns, approximately 300 microns, less than approximately 300 microns, approximately 200 microns, or less than approximately 200 microns. In some embodiments, stress-isolated MEMS device 100 may have a thickness between approximately 100 and approximately 400 microns, between approximately 200 and approximately 400 microns, between approximately 300 and approximately 400 microns, between approximately 100 and less than approximately 500 microns, between approximately 200 and less than approximately 500 microns, between approximately 300 and less than approximately 500 microns. Achieving such small dimensions is facilitated by use of the manufacturing methods described herein, and may not be achieved with conventional manufacturing methods. Manufacturing a stress-isolated MEMS device 100 according to the methods described herein may provide a smaller device, and/or may provide a device having a greater thickness of MEMS layer 124, which may provide enhanced performance of MEMS device 126. According to aspects of the present application, forming a cavity between an isolated substrate and a handle substrate may allow the handle substrate to be thinned, thereby providing a device that is thinner than a conventionally-manufactured device, for example, a device where a cap is provided below a cavity. Providing a thinner substrate may allow a thicker MEMS layer to be provided in a package having a same overall thickness as a conventional device. Having a thicker MEMS layer may allow larger movable beams and/or larger capacitive sensing elements to be incorporated into a MEMS device. Larger movable beams or larger sensing elements may react more accurately or precisely to a measured parameter and provide greater sensor performance.

According to some aspects of the present disclosure, stress-isolated MEMS device comprises MEMS layer 124. MEMS layer 124, and therefore MEMS device 126, may have various thicknesses. In some embodiments, MEMS layer 124 may have a thickness of about 8 microns, greater than about 8 microns, about 16 microns, greater than about 16 microns, about 32 microns, or greater than about 32 microns. Increased thickness of MEMS device 126 may enhance performance of MEMS device 126. For example, in embodiments where MEMS device 126 comprises a sensor, a thicker sensor, for example, an about 32 microns sensor, may have greater performance and/or resolution than a thinner sensor. The method of manufacture of stress-isolated MEMS device 100 described herein may allow MEMS layer 124 to have a greater thickness. MEMS layer 124 may be formed of polysilicon. In some embodiments, MEMS layer 124 may be formed of other conductive layers, for example, metallic silicide or metals such as aluminum.

According to aspects of the present application, a substrate, such as device substrate 102, isolation substrate 104, sacrificial substrate 106, or handle substrate 116, cap 132, or a wafer, may comprise various materials. In some embodiments, a substrate, cap, or wafer may comprise a semiconductor material. For example, a substrate, cap, or wafer may comprise a bulk or monocrystalline semiconductor substrate, such as a bulk or monocrystalline silicon substrate. In some embodiments, a substrate, cap, or wafer may comprise a deposited semiconductor substrate, such as polycrystalline silicon. In some embodiments, a substrate, cap, or wafer may comprise a silicon-on-insulator (SOI) substrate or may comprise a buried oxide layer. Other semiconductor materials may be used as substrates or wafers. In some embodiments, a substrate, cap, or wafer may comprise a glass substrate or a printed circuit board (PCB).

In various embodiments, oxide layers, such as first oxide layer 108a, second oxide layer 108b, third oxide layer 108c, fourth oxide layer 108d, or additional oxide layer 108e, may be formed of any suitable dielectric.

As shown in the illustrative embodiments of FIG. 1, device substrate 102 includes a platform 120. The platform 120 may be a stress-isolation platform. The platform 120 may be surrounded by a peripheral region 122 of the device substrate 122, MEMS device 126 may be disposed on the platform 120.

The platform 120 may be separated from the peripheral region 122 by at least one stress-isolation feature. For example, in some embodiments, the platform 120 is separated laterally from the peripheral region 122 by at least one trench 114. The at least one trench 114 may encircle the platform 120. During a manufacturing process of a stress-isolated MEMS device, a trench 114 may be formed by etching the device substrate 102, for example, by etching from a side of the device substrate 102 opposite the surface of the platform 120 upon which MEMS device 126 is formed.

In some embodiments, substrate 102 includes a cavity 112. For example, platform 120 may be formed above a cavity 112. Cavity 112 may be formed in the substrate by a backside etch. In some embodiments, cavity 112 may be connected to at least one trench 114. In some embodiments, a cavity 112 is disposed between handle substrate 116 and platform 120.

In some embodiments, at least one of the stress-isolation features described herein may form a stress-isolation gap. For example, cavity 112 and at least one trench 114 may form a stress-isolation gap.

In some embodiments, a cavity may comprise a pre-formed cavity. A cavity may be sealed. For example, a substrate may comprise an SOI substrate having a pre-formed cavity. In some embodiments, a substrate having a pre-formed cavity may be formed from a silicon-silicon fusion wafer bond. In some embodiments, a substrate having a pre-formed cavity may have its cavity formed in a different facility than the facility in which the stress-isolated MEMS device is formed. In some embodiments, a substrate having a pre-formed cavity may have its cavity formed in a same facility as the facility in which the stress-isolated MEMS device is formed. In some embodiments, providing a cavity having a pre-formed cavity during a manufacturing process of a stress-isolated MEMS device may reduce cost, result in a smaller size, and/or increase yield of the stress-isolated MEMS devices.

In some embodiments, stress-isolated MEMS device 100 may comprise a routing layer 118, Routing layer 118 may be configured to transmit electrical signals between various elements of stress-isolated MEMS device 100. For example, routing layer 118 may be coupled to various elements of MEMS device 126, jumpers 130, electrical conductors 138, and/or devices external to stress-isolated MEMS device 100. In some embodiments, routing layer 118 may be formed of polysilicon. In some embodiments, routing layer 118 may be formed of other conductive layers, for example, metallic suicide or metals such as aluminum.

In some embodiments, stress-isolated MEMS device 100 includes a cap 132. In some embodiments, cap 132 may be disposed above the platform 120. For example, cap 132 may enclose the MEMS device 126. Cap 132 may be bonded to the stress-isolation MEMS device 100 using cap seal 134.

Figure 6:
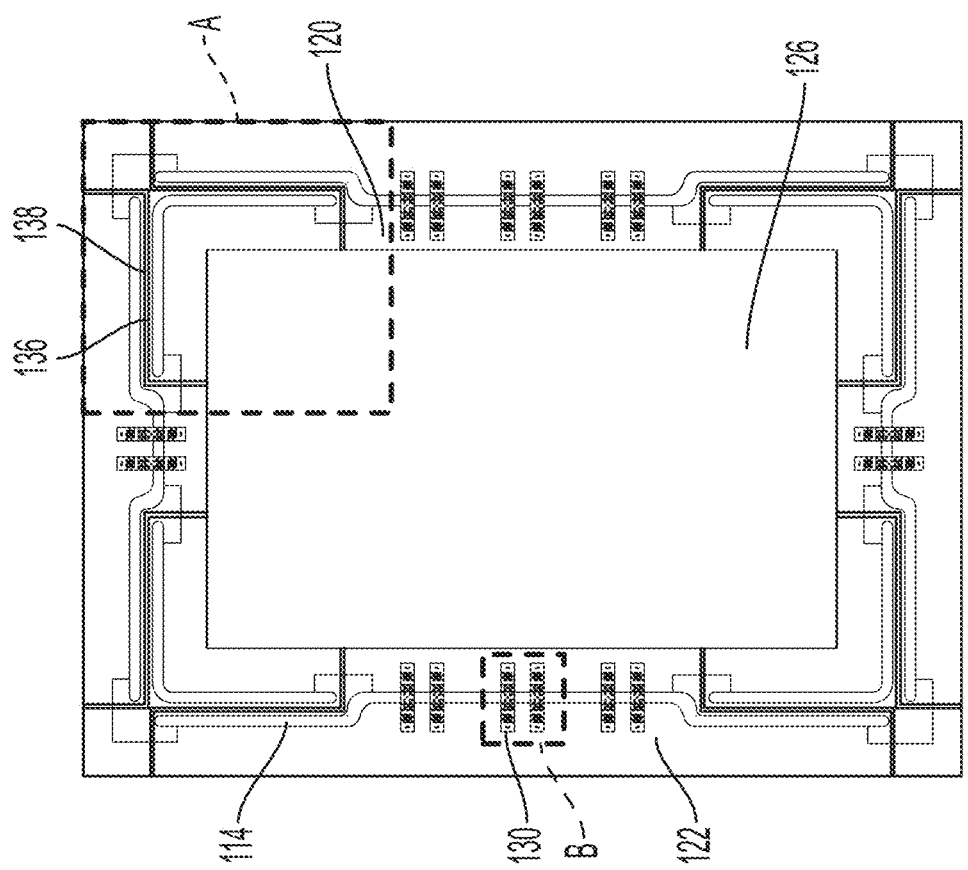
FIG. 6 shows a top view of some elements of a stress-isolated MEMS device.

FIG. 6 illustrates a top view of some elements of stress-isolated MEMS device 100. For example, FIG. 6 shows isolation substrate 104, trenches 114, platform 120, peripheral region 122, MEMS device 126, jumpers 130, tethers 136, and electrical conductors 138. For ease of understanding, FIG. 6 does not illustrate other elements of stress-isolated MEMS device 100.

Figure 7:
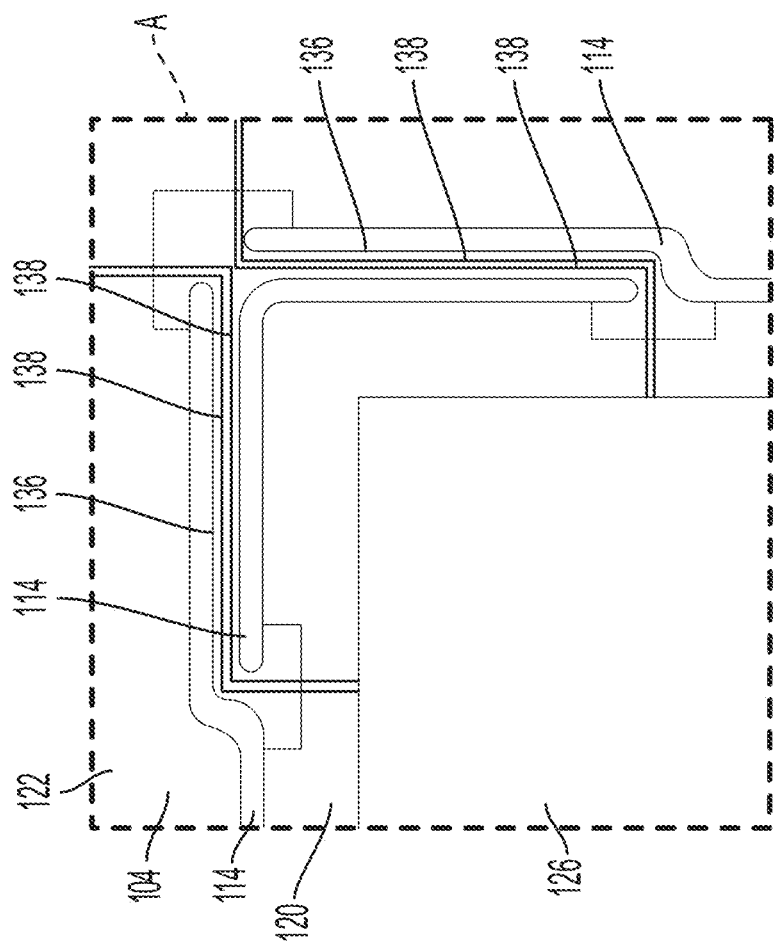
FIG. 7 shows a first detail top view of some elements of a stress-isolated MEMS device illustrated in FIG. 6.

FIG. 7 illustrates a first detail top view of the elements of stress-isolated MEMS device 100 illustrated in FIG. 6. As shown in detail A, FIG. 7 shows isolation substrate 104, trenches 114, platform 120, peripheral region 122. MEMS device 126, tethers 136, and electrical conductors 138. For ease of understanding, FIG. 7 does not illustrate other elements of stress-isolated MEMS device 100.

Figure 8:
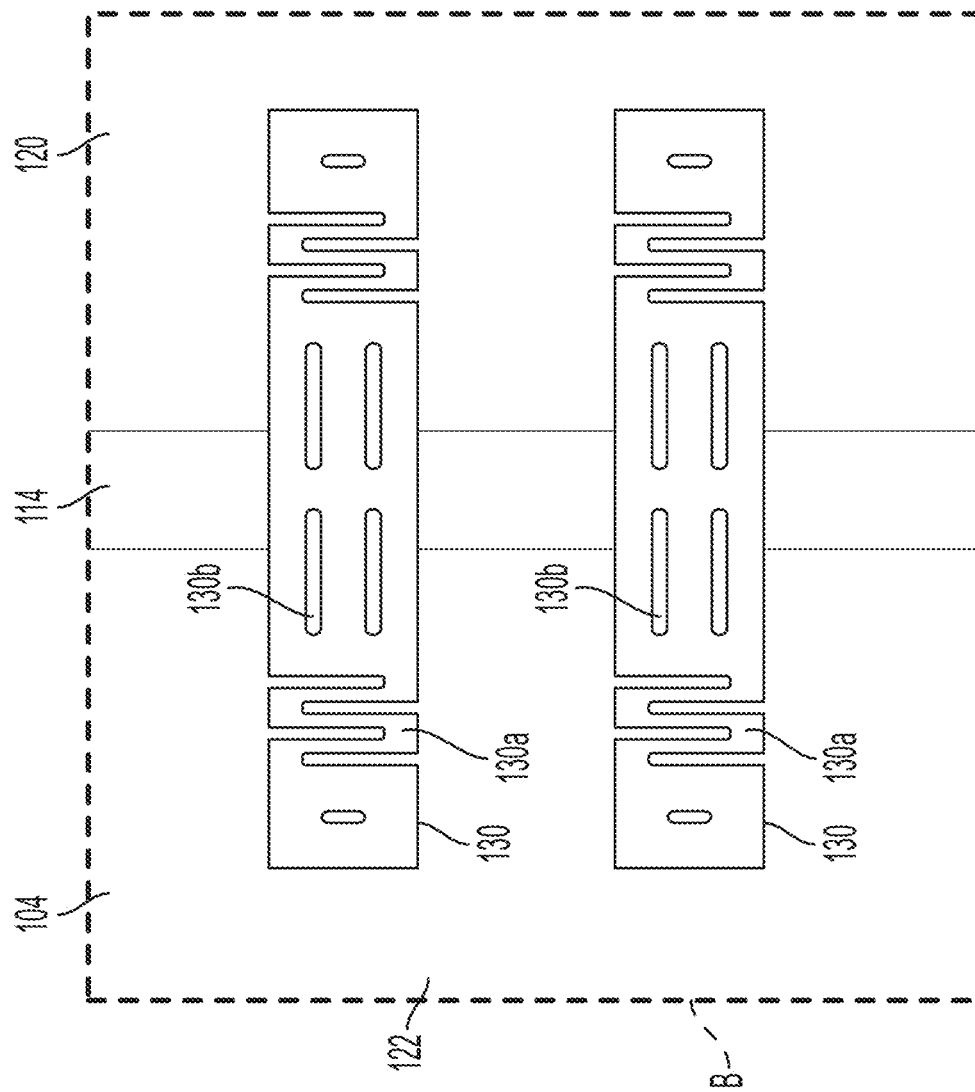
FIG. 8 shows a second detail top view of some elements of a stress-isolated MEMS device illustrated in FIG. 6.

FIG. 8 shows a second detail top view of some elements of a stress-isolated MEMS device illustrated in FIG. 6. As shown in detail B, FIG. 8 shows isolation substrate 104, trench 114, platform 120, peripheral region 122, and jumper 130. As shown in FIG. 8, jumpers 130 include flexible portions 130a, and openings 130b. For ease of understanding, FIG. 8 does not illustrate other elements of stress-isolated MEMS device 100.

Stress-isolated MEMS device 100 comprises at least one tether 136. In some embodiments, the at least one tether couples the platform 120 to the peripheral region 122, A tether 136 may extend across the at least one trench 114. In some embodiments, a tether 136 does not include a straight path across the at least one trench 114. For example, as shown in FIG. 7, a tether may include a first portion and a second portion arranged at an angle to each other, such as a right angle. In some embodiments, the tether 136 is flexible. For example, tether 136 may be flexible to stresses in the substrate 102. In some embodiments, tether 136 may be stiff to a parameter that MEMS device 126 is configured to measure. During a manufacturing process of stress-isolated MEMS device 100, a tether 136 may be formed by patterning a backside etch of isolation substrate 104 such that a portion of the isolation substrate 104 is left unetched. In some embodiments, a tether 136 and at least one trench 114 may be formed in a same etch, for example, a same backside etch.

In some embodiments, stress-isolated MEMS device 100 includes an electrical conductor 138. In other embodiments, stress-isolated MEMS device 100 may not comprise any electrical conductors 138. In some embodiments, an electrical conductor 138 is disposed on a tether 136. In some embodiments, an electrical conductor may be formed in a different layer than a layer in which a bridge is formed, for example, in routing layer 118. In some embodiments, an electrical conductor 138 is configured to couple an electrical signal from the platform 120 to the peripheral region 122. For example, electrical conductor may be coupled to MEMS device 126. In some embodiments, the electrical conductor 138 is flexible. For example, electrical conductor 138 may be flexible to stresses in the substrate 102.

In some embodiments, stress-isolated MEMS device may comprise at least one juniper 130. In other embodiments, stress-isolated MEMS device 100 may not comprise any jumpers 130, In some embodiments, a jumper 130 may be formed in a different layer than a layer in which a tether 136 is formed, for example, in MEMS layer 124. Accordingly, in some embodiments, a jumper 130 may be formed of polysilicon other conductive layers, for example, metallic silicide or metals such as aluminum. Jumpers 130 may be not aligned with tethers 136. For example, as shown in FIG. 6, jumpers 130 are not formed above tethers 136. A jumper 130 may form an electrical connection between platform 120 and peripheral region 122, For example, in some embodiments, a jumper 130 is configured to couple an electrical signal from the platform 120 to the peripheral region 122, For example, juniper 130 may be coupled to MEMS device 126. In some embodiments, the jumper 130 may span the at least one trench 114. In some embodiments, the jumper 130 is flexible. For example, juniper 130 may be flexible to stresses in the substrate 102. As shown in FIG. 8, jumper 130 may include one or more flexible portions 130a. In some embodiments, flexible portion 130a may absorb stress applies to jumper 130. In addition, jumper 130 may include openings configure to provide flexibility of the jumper 130, such as openings 130b.

Figure 9:
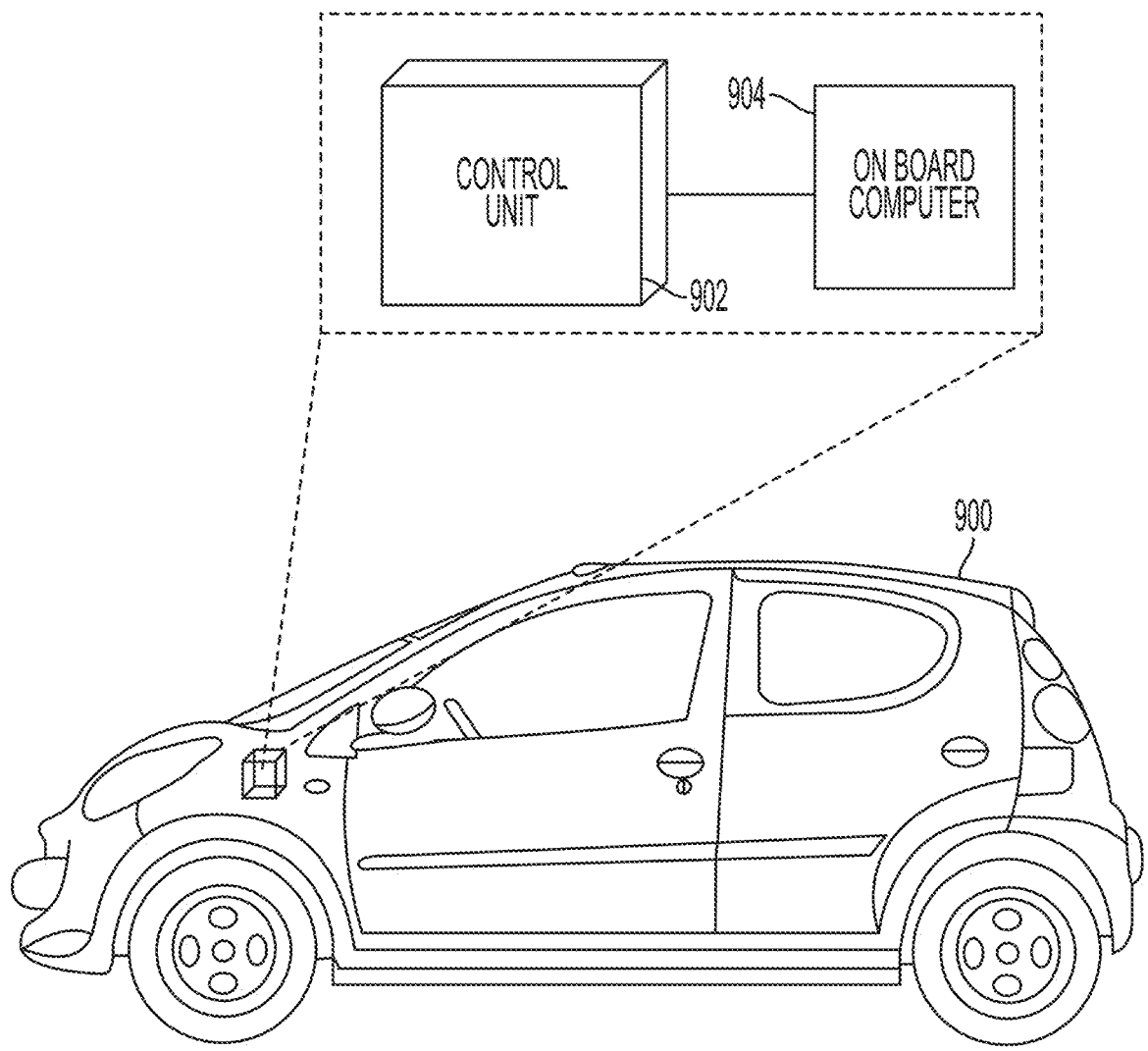
FIG. 9 shows an automobile that may include a stress-isolated device of one of the types described herein.

FIG. 9 illustrates a non-limiting example in which at least one stress-isolated device, such as a stress-isolated sensor, of the types described herein is employed in a car. In the example of FIG. 9, an automobile 900 includes a control unit 902 coupled to an onboard computer 904 of the car by a wired or wireless connection. Control unit 902 may include at least one stress-isolated device, such as a stress-isolated sensor, of the types described herein. As a non-limiting example, a stress-isolated device may comprise at least one accelerometer that may sense accelerations in the driving direction and/or direction perpendicular to the driving direction. The at least one accelerometer may also be configured to sense vertical accelerations, which may be useful to monitor the status of a suspension of the automobile 900, for example. The control unit 902 may receive power and control signals from the onboard computer 904 and may supply output signals of the type described herein to the onboard computer 904.

Figure 10:
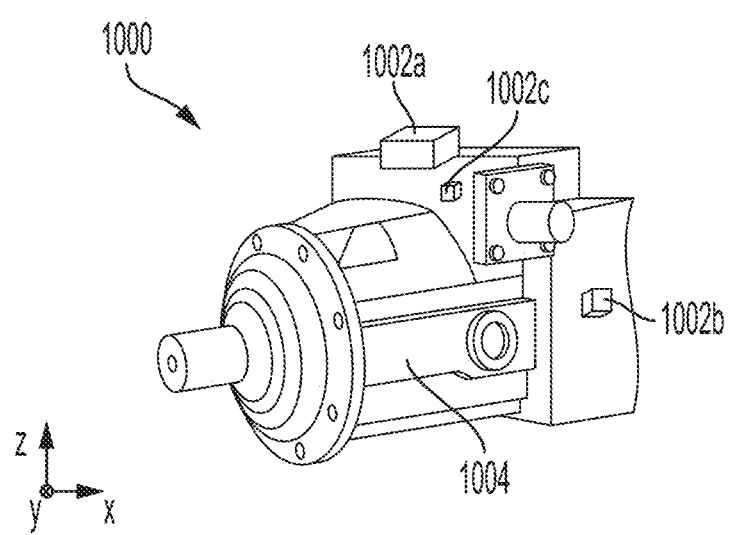
FIG. 10 shows a piece of industrial equipment on which are disposed three stress-isolated devices of the types described herein.

FIG. 10 illustrates a system 1000 including three stress-isolated devices, such as stress-isolated sensors of one or more of the types described herein. For example, the stress-isolated devices 1002a, 1002b, and 1002c may each comprise single-axis MEMS accelerometers coupled to a piece of industrial equipment 1004. The equipment 1004 may be a motor, although this is a non-limiting example. The stress-isolated devices 1002a, 1002b, and 1002c may be coupled to the equipment and configured to monitor vibration of the equipment with respect to a respective axis. For example, stress-isolated device 1002a may be oriented to detect z-axis acceleration, stress-isolated device 1002b y-axis acceleration, and stress-isolated device 1002c x-axis acceleration. In an alternative embodiment, two or more of the stress-isolated devices 1002a, 1002b, and 1002c may be combined into a single package or housing, as opposed to the illustrated configuration of three distinct housings. The system may wirelessly communicate acceleration data generated by the respective accelerometer. Energy to power the stress-isolated device may be harvested from the vibration of the equipment 1004. Other configurations are possible.

Various aspects of the present application may provide one or more benefits. Some examples are now listed. It should be appreciated that not all aspects necessarily provide all benefits and benefits other than those listed may be provided by one or more aspects. According to some aspects of the present application, stress-isolation of devices, such as sensors and/or MEMS devices is provided. The stress-isolated devices may have a greater thickness of MEMS layers (which may result in higher sensitivity of devices), have a smaller size (fir example, a smaller thickness), have greater electrical connectivity, have a lower cost, or have a greater yield. In some embodiments, stress-isolation may be particularly beneficial at high temperatures or in high acceleration environments.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately," "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A method of manufacture of a stress-isolated microelectromechanical systems (MEMS) device, comprising:
    providing a substrate having a first side and a second side opposite the first side;
    etching a trench in the first side of the substrate;
    forming a platform adjacent to and substantially surrounded by the trench; and
    subsequent to etching the trench, forming a MEMS device on a surface of the platform opposite the first side of the substrate.

2. The method of claim 1, wherein etching the trench comprises defining a plurality of tethers at locations configured to connect the platform to a periphery of the substrate.

3. The method of claim 1, further comprising forming the MEMS device on the surface of the platform to include a movable sensing mass having a thickness of approximately 8 microns or greater.

4. The method of claim 1, wherein forming the platform further comprises etching a cavity in the first side of the substrate prior to etching the trench, wherein the cavity laterally extends at least to the trench.

5. The method of claim 4, further comprising:
    etching the cavity to a first depth; and
    etching the trench to a second depth greater than the first depth.

6. The method of claim 4, wherein the substrate comprises a first substrate, and wherein the method further comprises, after etching the trench and after etching the cavity, bonding a second substrate to the first substrate, over the cavity and the trench, to form a sealed cavity.

7. The method of claim 6, further comprising thinning the second substrate such that the stress-isolated MEMS device has a thickness of less than approximately 500 microns.

8. A method of forming a stress-isolated microelectromechanical systems (MEMS) device, comprising:
    defining a suspended platform at least in part by backside etching a wafer, the backside etching defining a plurality of tethers positioned to connect the suspended platform to a peripheral region; and
    subsequent to the backside etching, forming the MEMS device on a front side of the suspended platform.

9. The method of claim 8, wherein backside etching the wafer comprises forming a trench in the wafer, and wherein the method further comprises forming a jumper spanning the trench and not aligned with any of the plurality of tethers.

10. The method of claim 9, wherein forming the MEMS device comprises forming a movable sensing mass, and wherein forming the jumper comprises forming the jumper from a common layer with the movable sensing mass.

11. The method of claim 8, wherein the wafer is a first wafer, and wherein the method comprises bonding the first wafer and a second wafer prior to backside etching the first wafer, removing the second wafer from the first wafer subsequent to backside etching the first wafer, and bonding the first wafer to a third wafer prior to forming the MEMS device on the front side of the suspended platform.

12. The method of claim 8, wherein forming the stress-isolated MEMS device comprises defining a thickness of the MEMS device and of the wafer to be less than 500 microns total.

13. The method of claim 8, wherein the wafer is a first wafer, and wherein the method further comprises bonding a cap wafer to the first wafer.

14. The method of claim 8, wherein backside etching of the wafer comprising a first etch defining a cavity and a second etch defining a trench through a portion of the cavity.

* * * * *